United States Patent
Franca-Neto et al.

(10) Patent No.: US 9,741,769 B1
(45) Date of Patent: Aug. 22, 2017

(54) VERTICAL MEMORY STRUCTURE WITH ARRAY INTERCONNECTS AND METHOD FOR PRODUCING THE SAME

(71) Applicant: Western Digital Technologies, Inc., San Jose, CA (US)

(72) Inventors: Luiz M. Franca-Neto, Sunnyvale, CA (US); Jeffrey Lille, Sunnyvale, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/132,609

(22) Filed: Apr. 19, 2016

(51) Int. Cl.
*H01L 27/00* (2006.01)
*H01L 27/24* (2006.01)
(Continued)

(52) U.S. Cl.
CPC .......... *H01L 27/249* (2013.01); *G11C 13/004* (2013.01); *G11C 13/0004* (2013.01); *G11C 13/0007* (2013.01); *G11C 13/0026* (2013.01); *G11C 13/0028* (2013.01); *G11C 13/0069* (2013.01); *H01L 27/0688* (2013.01); *H01L 27/11551* (2013.01); *H01L 27/11578* (2013.01); *H01L 27/2427* (2013.01); *H01L 27/2481* (2013.01); *H01L 45/065* (2013.01); *H01L 45/085* (2013.01); *H01L 45/1233* (2013.01); *H01L 45/1253* (2013.01); *H01L 45/141* (2013.01); *H01L 45/146* (2013.01); *H01L 45/1616* (2013.01)

(58) Field of Classification Search
CPC ............ H01L 27/2481; H01L 27/0688; H01L 27/11578; H01L 27/11551
See application file for complete search history.

(56) References Cited

U.S. PATENT DOCUMENTS 8,081,515 B2   12/2011   Satoh
8,609,492 B2   12/2013   Beigel et al.
(Continued)

OTHER PUBLICATIONS

Kim, et al; Novel Vertical-Stacked-Array-Transistor (VSAT) for ultra-high-density and cost-effective NAND Flash memory devices and SSD (Solid State Drive); VLSI Technology, 2009 Symposium on, <http://ieeexplore.ieee.org/stamp/stamp.jsp?tp=&arnumber=5200592&isnumber=5200578>; dated 2009; 1 page.

(Continued)

*Primary Examiner* — Ngan Ngo
(74) *Attorney, Agent, or Firm* — Patterson + Sheridan, LLP

(57) ABSTRACT

Disclosed herein is a method and apparatus for fabricating a memory device. The memory device has a vertical stack of alternating layers of conductive and insulating layers wherein a top layer and a bottom layer are insulating layers. A plurality of vias is formed through the vertical stack from the top layer to the bottom layer. A memory layer disposed adjacent the conductive layers in the vias. A selector device disposed adjacent the memory layer wherein the selector device comprises multiple layers of dissimilar metal oxides. A lateral electrical contact to the memory layer through the conductive layer. And a top contact electrically connected to the conductive layer through a portion of the memory layer and the portion of the memory layer wherein the portion of the memory layer is configured to store data therein.

14 Claims, 4 Drawing Sheets

(51) Int. Cl.
*H01L 45/00* (2006.01)
*G11C 13/00* (2006.01)
*H01L 27/06* (2006.01)
*H01L 27/11551* (2017.01)
*H01L 27/11578* (2017.01)

(56) References Cited

U.S. PATENT DOCUMENTS

| | | |
|---|---|---|
| 8,946,810 B2 | 2/2015 | Alsmeier |
| 2012/0261638 A1 | 10/2012 | Sills et al. |
| 2015/0138880 A1 | 5/2015 | Russo et al. |
| 2016/0126248 A1* | 5/2016 | Rabkin ............... H01L 29/408 257/321 |
| 2017/0025431 A1* | 1/2017 | Kanakamedala . H01L 27/11578 |
| 2017/0040339 A1* | 2/2017 | Lee ................... H01L 27/11582 |
| 2017/0062456 A1* | 3/2017 | Sugino ............. H01L 27/11582 |
| 2017/0062472 A1* | 3/2017 | Park ................. H01L 27/11582 |
| 2017/0077139 A1* | 3/2017 | Iguchi .............. H01L 27/11582 |
| 2017/0103993 A1* | 4/2017 | Lee .................. H01L 27/11565 |

OTHER PUBLICATIONS

Fukuzumi, et al.; Optimal Integration and Characteristics of Vertical Array Devices for Ultra-High Density, Bit-Cost Scalable Flash Memory; Electron Devices Meeting 2007; dated 2007; 1page; <http://ieeexplore.ieee.org/stamp/stamp.jsp?tp= &arnumber=4418970&isnumber=4418848>.

* cited by examiner

VERTICAL MEMORY STRUCTURE WITH ARRAY INTERCONNECTS AND METHOD FOR PRODUCING THE SAME

BACKGROUND OF THE DISCLOSURE

Field of the Disclosure

Embodiments of the present disclosure generally relate to an electronic device, and more specifically, to a 3D memory cell.

Description of the Related Art

The heart of a computer is memory. The memory is typically used for storing programs, routines, a computer state, or other bits of information used in the operation and control of computers. Decreasing the size of computers has necessitated the reduction in the space available for memory cells while the requirements for larger memory capacity have continued to grow.

Phase change memory (PCM) is a type of non-volatile memory technology. PCM is an emerging technology and a candidate for storage class memory (SCM) applications and a serious contender to dislodge NOR and NAND flash memory in solid state storage applications and, in the case of NAND flash, solid-state drives (SSDs). PCM functions based upon switching a memory cell, typically based on chalcogenides such as $Ge_2Sb_2Te_5$, between two stable states, a crystalline state and an amorphous state, by heating the memory cell. To heat the memory cell, an electrical current flows through the PCM cell.

PCM cells are arranged in an array, and each PCM cell is coupled with a selecting switch such as an ovonic threshold switch (OTS). Word lines (WL) and bitlines (BL) are arranged so that each memory cell can be programmed or queried. A row of PCM cells is activated by a single word line WL and each one of the PCM cells in that row will affect the bitline BL to which it is electrically connected according to the state of the PCM cells, i.e. according to the PCM cells being in their high (amorphous) or low (crystalline) resistance state.

The incorporation of 3D elements is difficult from a wiring perspective due to complexity. Electrically isolating each memory element and addressing adjacent devices that are not only separated in the lateral direction have proven to be problematic. The high density devices promote sneak currents between the elements that make reading the memory element difficult or inaccurate.

Therefore, there is a need for an improvement in the high density of devices in 3D memory.

SUMMARY OF THE DISCLOSURE

Disclosed herein is a method and apparatus for fabricating a memory device. In one embodiment, the memory device has a vertical stack of alternating layers of conductive and insulating layers wherein a top layer and a bottom layer are insulating layers. A plurality of vias is formed through the vertical stack from the top layer to the bottom layer. A memory layer disposed adjacent the conductive layers in the vias. A selector device disposed adjacent the memory layer wherein the selector device comprises multiple layers of dissimilar metal oxides. A lateral electrical contact to the memory layer through the conductive layer. And a top contact electrically connected to the conductive layer through a portion of the memory layer and the portion of the memory layer wherein the portion of the memory layer is configured to store data therein.

In a second embodiment, a memory device is disclosed in a vertical substrate stack having alternating layers of conductive layers and insulating layers, wherein the vertical stack has one more insulating layer than conductive layers and a bottom layer being an etch stop layer and the top layer being one of the insulating layers. The memory device has a plurality of vias disposed through the vertical stack the top layer to the etch stop layer. The memory device also has a metal oxide layer adjacent the conductive layers in the vias configured to store a value of resistance at discrete locations along the metal oxide layer and a plurality of layers disposed adjacent the memory layer. A top contact is electrically connected to the conductive layer through the plurality of layers at one of the discrete locations along the metal oxide layer.

In yet a third embodiment, a method for fabricating a memory cell component in a substrate is disclosed. In the method, an etch-stop layer is deposited on a substrate. Alternating layers of conductor and insulator materials are deposited over said etch-stop layer to create a vertical stack wherein the first and last layer is formed from the conductor material. A hardmask layer is then deposited on the vertical stack. A via having walls is etched through the vertical stack to expose the etch-stop layer. A first layer is deposited on the wall of the via. A second layer is deposited on the first layer. A third layer is deposited on the second layer. A fourth layer is deposited on the third layer. A top conductor is deposited on the fourth layer for forming one or more memory cells electrically connected to a portion of said top conductor and the layer of conducting material.

In yet a fourth embodiment, a memory device is disclosed in a vertical stack of alternating layers of conductive and insulating layers wherein a top layer and a bottom layer are insulating layers. Pluralities of vias are disposed through the vertical stack from the top layer to the bottom layer. A memory layer is disposed adjacent the conductive layers in the vias. A selector device is disposed adjacent the memory layer, wherein the selector device comprises multiple layers of dissimilar metal oxides. The multiple layers of dissimilar metal oxides have a first layer of $TiO_2$ of about 21 nm thick, a second layer of $Al_2O_3$ of about 2 nm thick, and a third layer of $TiO_2$ of about 21 nm thick wherein the thickness for each of the first layer and the third layer is greater than the thickness of the second layer. One or more lateral electrical contacts to the memory layer is provided through the conductive layer. A top contact electrically connects to the one or more lateral electrical contacts through a portion of the memory layer and the portion of the memory layer is configured to store data therein.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Disclosed is a method and apparatus for fabricating a memory cell. An etch-stop layer is deposited on a substrate. Alternating layers of conductor and insulator materials are deposited over said etch-stop layer to create a vertical stack wherein the first and last layer is formed from the conductor material. A hardmask layer is deposited on the vertical stack. A via having walls is etched through the vertical stack to expose the etch-stop layer. A first layer is deposited on the wall of the via. A second layer is deposited on the first layer. A third layer is deposited on the second layer. A fourth layer is deposited on the third layer. A top conductor is deposited on the fourth layer. Finally, one or more memory cells are formed in the via and electrically connected to a portion of said top conductor and the layer of conducting material. The memory cell is configured to store data therein.

Figure 1:
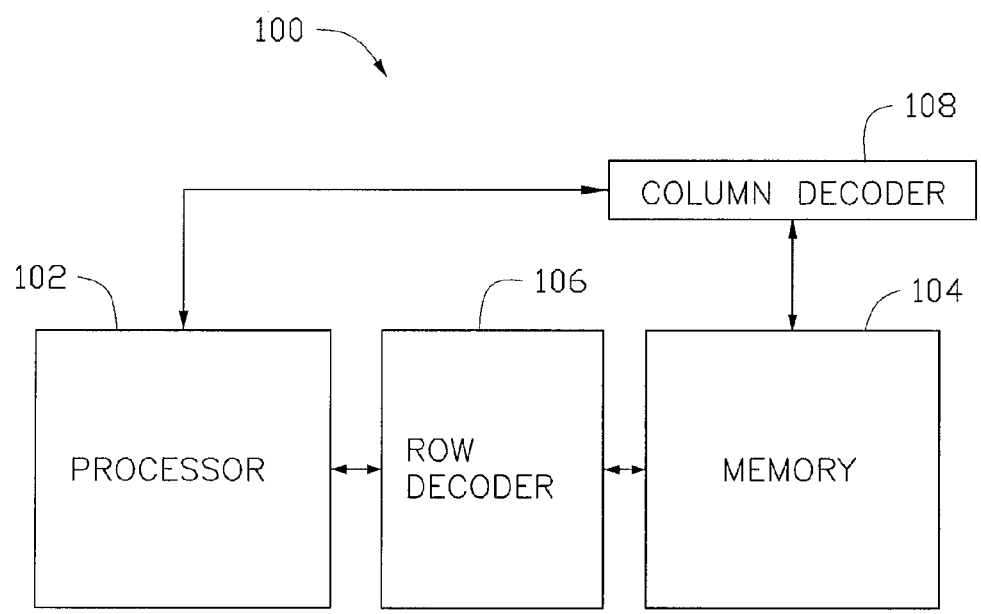
FIG. 1 is a block diagram of an example processing system.

FIG. 1 is a block diagram of a processing system 100 having a processing device 102 and memory cell 104. The memory cell 104 comprises memory cells that are arranged in an array formation of rows and columns. The processing device 102 interfaces with the array of memory cells via a row decoder 106 and column decoder 108. Individual memory cells are controlled by word lines that may extend along the rows of the array and bit lines that may extend along columns of the array. A memory cell may exist at a junction between the word and bit lines. During a read/write cycle, a row decoder selects a row page of memory cells to be read from or written to. Likewise, the column decoder selects a column address of memory cells for the read/write cycle. In certain embodiments of the present disclosure, each memory cell (e.g., at a junction between the word and bits lines) may include at least one of a memory material (e.g. a resistive RAM (RRAM) element such as a metal oxide, or a phase change memory (PCM) cell (e.g., using phase change material) or a selector leg such as an ovonic threshold switch (OTS)).

Figure 2:
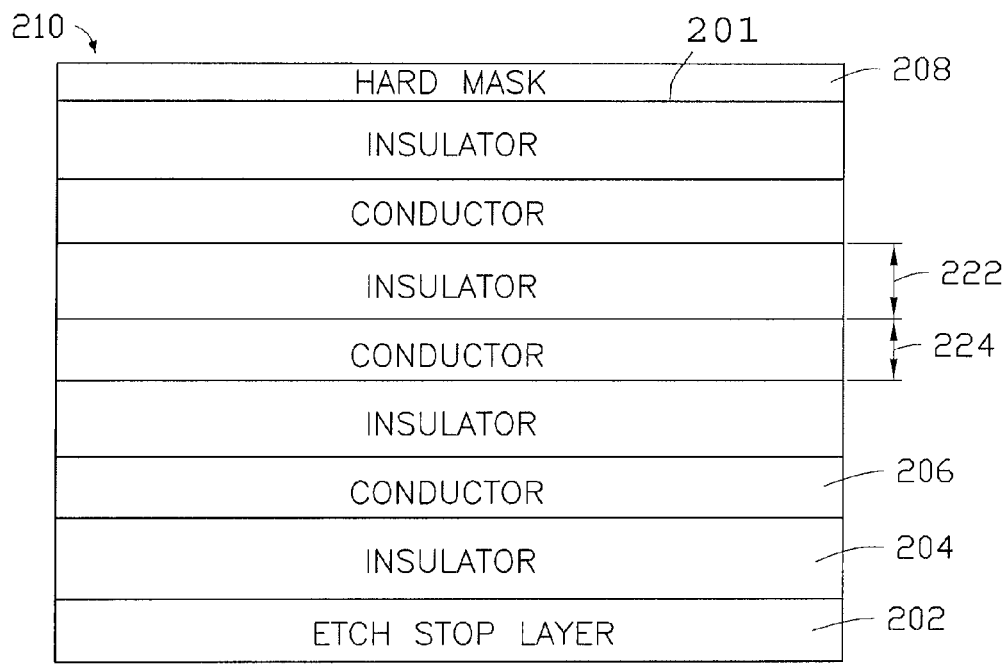
FIG. 2 illustrates a side plan view an example vertical stack of alternating layers of conductive and insulator materials, in accordance with certain embodiments of the present disclosure.

FIG. 2 illustrates a side plan view an example vertical stack 210 of alternating layers of a conductive layer 206 of material and an insulator layer 204 of material, in accordance with certain embodiments of the present disclosure. The vertical stack 210 may be disposed on top of an etch-stop layer 202 in a substrate. A hardmask layer 208 may be formed on top of the vertical stack 210. The vertical stack 210 may be formed on the etch-stop layer 202 with the first and last layer prior to the hardmask layer 208 being the insulator material such as insulator layer 204. The conductive layer 206 is formed between two of the insulator layer 204. Thus, the vertical stack 210 has at least one additional insulator layer 204 than conductive layers 206. For example, the vertical 210 may have 7 layers of alternating isolative and conductive material wherein 4 of the 7 layers are the insulator layers 204 and 3 of the layers are the conductive layers 206. The vertical stack 210 may comprise any number of insulator and conductor layers 204, 206, in an alternating fashion as illustrated.

The etch-stop layer 202 may be deposited over a substrate (not shown). The vertical stack 210 of conductor and insulator layers 206, 204 are deposited on the etch-stop layer 202 in an alternating pattern. In certain embodiments, the etch-stop layer 202 can be made of any material that does not etch in a fluorine containing plasma, such as chrome, magnetic metal, or an oxide that does not etch in fluorine such as aluminum oxide.

In certain embodiments, the insulator layer 204 is formed from a non-conductive material. That is, the insulator layer 204 is not electrically conductive and impedes the flow of electrons therethrough. For example, the insulator layer 204 can be silicon dioxide ($SiO_2$) or other suitable electrically insulated material. A thickness 222 of the insulator layers 204 may range from about 10 nanometers to about 100 nanometers, such as about 10 nanometers.

The conductive layer 206 is electrically conductive. The conductive layer 206 may be formed from a metal material. For example, the conductive layer may be metal compound comprising one or more of titanium (Ti), tungsten (W), copper (Cu), molybdenum (Mo), chromium (Cr), gold (Au), tantalum (Ta), a polycrystalline form of silicon, or other suitably electrically conductive material. A thickness 224 of the conductor layers 206 may range from about 10 nanometers to about 100 nanometers, such as about 10 nanometers. In certain embodiments, the thickness 224 of the conductive layer 206 may be substantially similar to the thickness 224 of the insulator layers 204. In certain embodiments, the thickness 222 of the conductive layer 206 may be less than the thickness 224 of the insulator layers 204.

The hardmask layer 208 is deposited over the vertical stack 210 and is used as an etch mask. The hardmask layer 208 facilitates etching of the underlying vertical stack 210 and may be formed from one or more layers of materials. For example, the hardmask layer 208 may be formed from a layer of silicon oxide (SiO$_2$) and a layer of chrome (Cr). A layer of Cr may be deposited on a top surface 201 of the vertical stack 210. A subsequent layer of SiO$_2$ may be deposited on the Cr to form the hardmask layer 208. Alternately, the hardmask layer 208 may be formed from a diamond like carbon (DLC) material or a non-etchable oxide (e.g. Al$_2$O$_3$).

Figure 3:
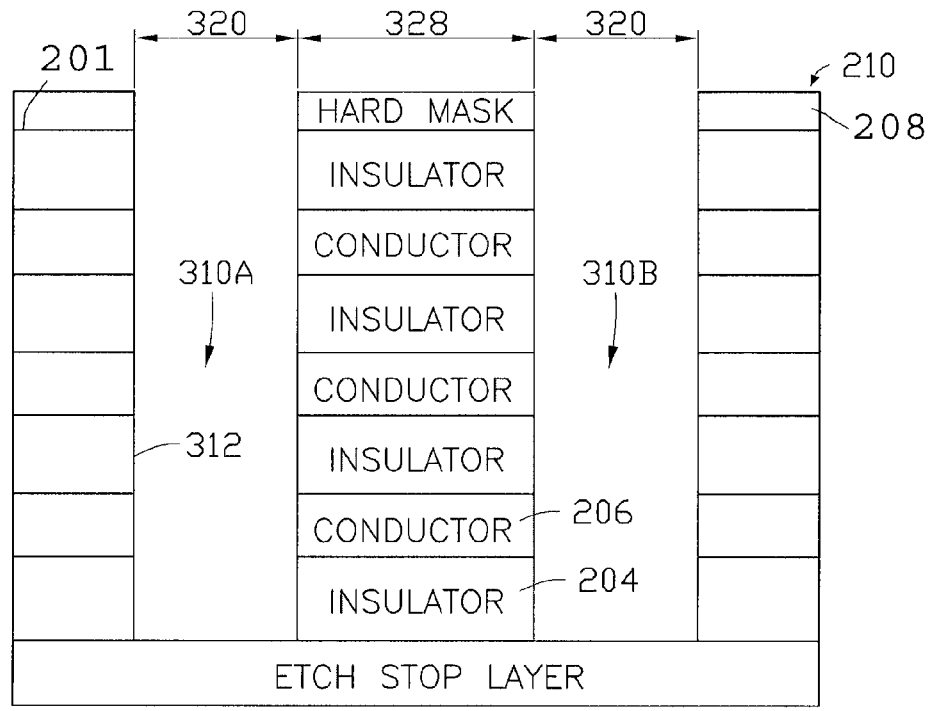
FIG. 3 illustrates a side plan view of two vias formed in the example vertical stack of alternating layers of conductive and insulator materials, in accordance with certain embodiments of the present disclosure.

FIG. 3 illustrates a side plan view of two vias 310A, 310B formed in the example vertical stack 210 of alternating layers of conductive and insulator materials, in accordance with certain embodiments of the present disclosure. One or more vias 310 may be formed within the vertical stack, as illustrated in FIG. 3. The vias 310 have walls 312. A masking layer (not shown) such as a photoresist, may be deposited over the hardmask layer 208 in a pattern leaving exposed portions of the hardmask layer 208 where trenches are formed for patterning the hardmask layer 208. Using an etch chemistry that will etch the material of the hardmask layer 208, those portions of the hardmask layer 208 exposed by the patterned masking layer, i.e., photo-resist, disposed on top of the hardmask layer 208, may be removed. The hardmask layer 208 may be etched with the ionization of one or more process gasses, such as a chlorine (Cl) or fluorine (F) gas. In one example, the hardmask layer 208 may have two layers, a Cr layer disposed on the insulator layer 204 and a SiO$_2$ layer disposed on the Cr layer. F ions may be used to etch a pattern in the SiO$_2$ layer exposing the Cr layer which the F ions will not etch. The etchant may then be switched to Cl which will etch the Cr without etching the SiO$_2$ in the hardmask layer 208 or the insulator layer 204 in the vertical stack 210 below the hardmask layer 208. The hardmask layer 208 now has a pattern of openings exposing the vertical stack 210 for forming the vias 310A, 310B. The etchant may then be switched back to F to etch the vias 310 into the vertical stack 210 down to the etch-stop layer 202. FIG. 3 illustrates two vias 310, via 310A and via 310B. It should be appreciated that the number of vias 310 formed in the vertical stack 210 may be significantly greater than the representative example to support a large storage capacity in the memory devices. Furthermore, the etched vias may be in the form of a trench or trenches.

At this stage, only portions of the vertical stack 210 where the vias 310 are to be formed are exposed, and other portions are covered by the hard mask material. Thus, using an etch chemistry, such as F, that will etch the alternating layers of the insulator layers 204 and conductor layers 206 in the vertical stack 210, vias 310, such as via 310A and 310B, may be formed in the vertical stack 210 down to and exposing the etch-stop layer 202. The vias 310A, 310B may have substantially vertical walls 312. The vertical walls 312 extend from the top surface 210 to the etch stop layer 202. In certain embodiments, a reactive-ion etching (ME) process may be used to form vias 310A and 310B. Optionally, the hardmask layer 208 may be removed after the trenches are formed. For example, the remaining Cr layer in the hardmask layer 208 may be etched away with Cl, planarized or removed by another suitable method.

Figure 4:
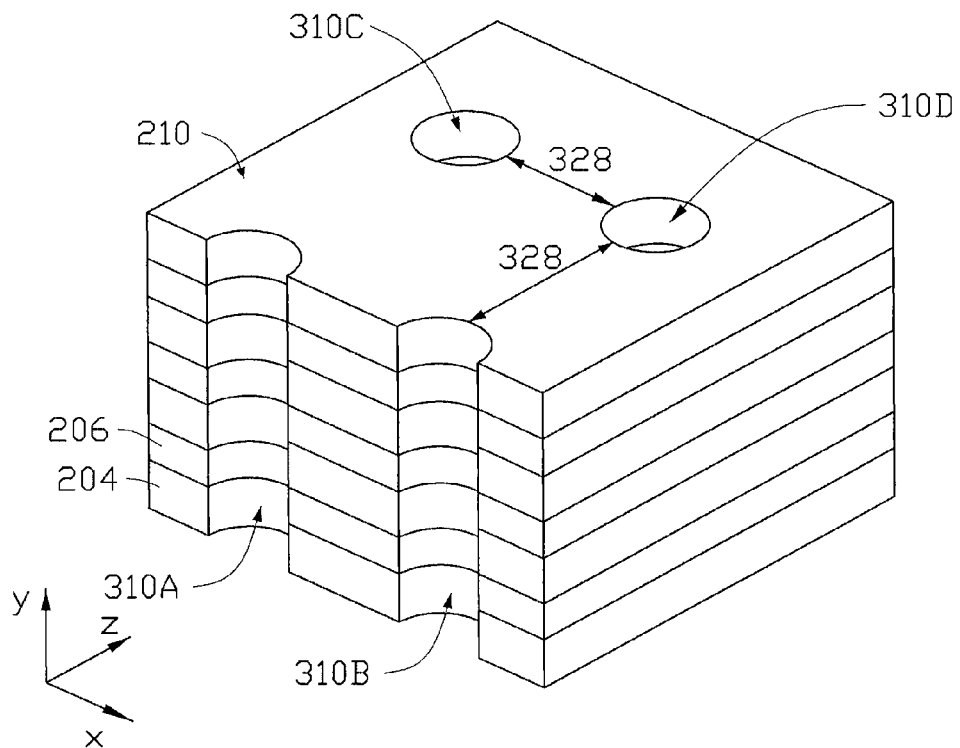
FIG. 4 illustrates a perspective view of the example vertical stacks of FIG. 3, in accordance with certain embodiments of the present disclosure.

FIG. 4 illustrates a perspective view of the vertical stack 210 of conductor layers 206 and insulator layers 204 comprising vias 310A, 310B, 310C and 310D (collectively vias 310). In one embodiment, each via 310 may be have a cylindrical shape extending through the vertical stack of conductor and insulator layers 204, 206 exposing the etch-stop layer 202 (Not shown). In other embodiments, each of the vias 310 may have a profile shape through the vertical stack 210 suitable for forming memory devices therein. In one embodiment, each via 310 exposes a substantially flat surface portion of the etch-stop layer 202. The vias 310 may be substantially equidistantly spaced apart such that a distance 328 from adjacent vias is substantially similar throughout the vertical stack 210. Alternately, the distance 328 between vias 310 may be arranged to accommodate the packaging of the devices on a board or other interface.

Figure 5:
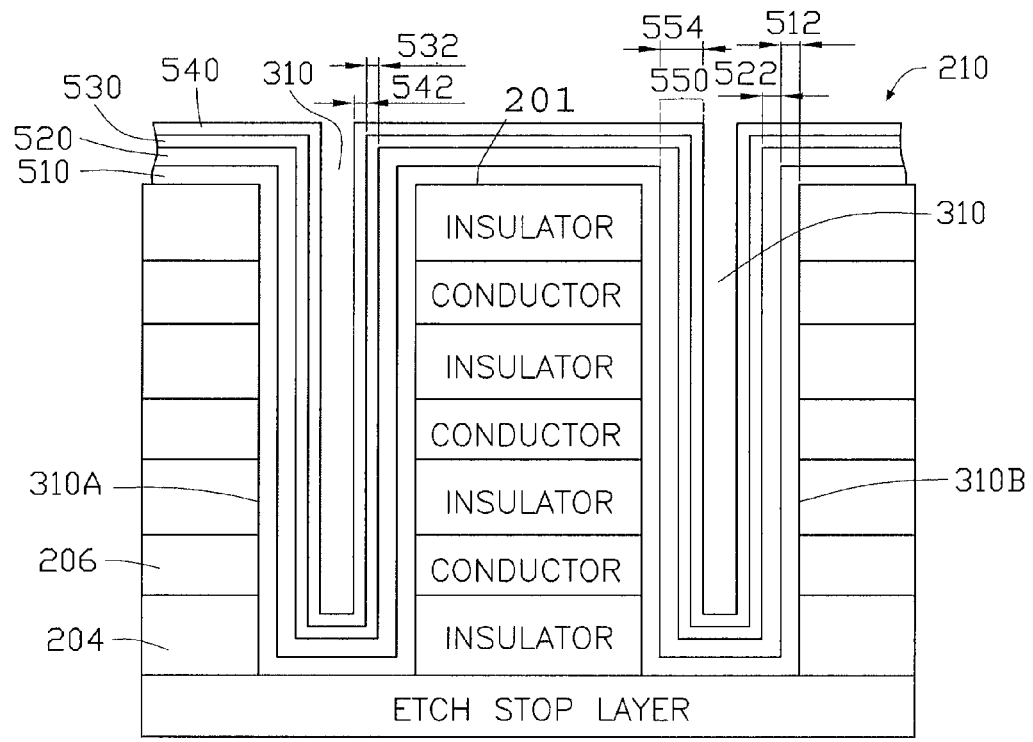
FIG. 5 illustrates a plan view of the example vertical stack in FIG. 3 having material deposited for forming a memory cell, in accordance with certain embodiments of the present disclosure.

FIG. 5 illustrates a plan view of the example vertical stack 210 in FIG. 3 having material deposited for forming a memory cell, in accordance with certain embodiments of the present disclosure. Each via 310 may have one or more addressable memory cells formed therein corresponding to the number of conductor layers 206 in the vertical stack 210. The vias 310 may have a plurality of layers deposited therein forming one or more memory cells adjacent each of the conductor layers 206 in the vertical stack 210. In one embodiment, four (4) layers of material are deposited in the vias 310 along with a contact layer (conductive top electrode 610 in FIG. 6) to form memory cells, e.g., memory cells 650, 666, 670 illustrated in FIG. 6.

In one embodiment, a first layer 510 may be deposited on the vertical stack 210 and into the vias 310A, 310B forming on the walls 302 therein. The first layer 510 may be a memory layer suitable for forming memory cells such as those found in phase change (PCM) or resistive ram (RRAM) to name a few. Depending on the material used to plate the conductive layers 206, the devices formed adjacent to the conductive layer 206 may have different electrical properties or may have properties affected by passing a current therethrough. For example, in certain embodiments, a material may be used such that the device exhibits the electric property of a phase change material with a change in resistance. Such materials may be GeSbTe, SeTe, SiTe, SbSe, SnSe, SnTe, SnSb, GeSb, GeS, GeTe, SiSb, or alloys thereof. The device may also be a resistive RAM material that has different resistive states (e.g., HFO$_x$, WO$_x$, TaO$_x$, or nT:O$_x$). An electrical behavior of phase change material is characterized by a shift from a blocking state (e.g., effectively an open circuit or highly resistive state) to a resistive state, based on whether a voltage applied to the phase change material reaches a certain threshold. In other embodiments, a plating material may be used such that the device has a selector electric property of an ovonic threshold switch (OTS), such as GeSeBi. An OTS is a two terminal device that shifts from a blocking state (e.g., a high resistive state) to a conductive state based on whether a voltage applied to the OTS reaches a certain threshold. Other selector materials can be alloys of GeSCu, or copper (Cu) doped metal oxides such as Cu doped HFO$_2$. In one embodiment, the first layer 510 may be an oxide, such as a metal oxide. For example, the first layer 510 may be formed from aluminum monoxide (AlO), aluminum nitride (AlN), tantalum oxide (TaO$_x$), hafnium oxide (HfO$_x$), or other suitable material. The first layer 510 may be deposited or otherwise formed during a layer deposition process such as an atomic layer deposition (ALD) process. The first layer 510 may have a thickness 512 of between about 1 nm to about 5 nm. In one embodiment, the thickness 512 of the first layer 510 is about 2 nm.

A second layer 520 may be formed on the first layer 510. The second layer 520 may be a doped material. The electrical properties of the second layer 520 may be modified to effect the flow of electrons therethrough and thus the overall resistance of electrical pathway through a device formed in the via 310. Alternately, the material of the second layer 520 may be selected from naturally occurring materials. For example, the second layer 520 may be formed from titania (TiO$_2$), zinc oxide (ZnO), compounds thereof or other suitable materials. The second layer 520 may be deposited or otherwise formed during a layer deposition process such as an atomic layer deposition (ALD) process. The second layer 520 may have a thickness 522 of between about 10 nm to about 20 nm, such as about 17 nm. In one embodiment, the second layer 520 is formed from TiO$_2$ by ALD to the thickness 522 of about 17 nm.

A third layer 530 may be formed on the second layer 520. The third layer 530 may be a doped material. The third layer 530 may be formed from aluminum oxide (Al$_2$O$_3$), aluminum monoxide (AlO), aluminum nitride (AlN), tantalum oxide (TaO$_x$), hafnium oxide (HfO$_x$) or other suitable material. The third layer 530 may be deposited or otherwise formed during a layer deposition process such as an atomic layer deposition (ALD) process. The third layer 530 has a thickness 532 of between about 1 nm and 5 nm, such as about 2 nm. In one embodiment, the third layer 530 is formed from Al$_2$O$_3$ by ALD to the thickness 532 of about 2 nm.

A fourth layer 540 may be formed on the third layer 530. The fourth layer 530 may be formed from titania (TiO$_2$), zinc oxide (ZnO), compounds thereof or other suitable materials. The fourth layer 540 may be deposited or otherwise formed during a layer deposition process such as an atomic layer deposition (ALD) process. The fourth layer 540 may have a thickness 542 of between about 1 nm and 5 nm, such as about 2 nm. In one embodiment, the fourth layer 540 is formed from TiO$_2$ by ALD to the thickness 542 of about 2 nm.

In a second embodiment, the selector device 550 may be deposited on the vertical stack 210 and in the walls 312 of the vias 310A, 310B prior to the deposition of the memory layer. For example, the selector device 550 may include the first layer 510, the second layer 520, and the third layer 530 and the memory layer may now be in the fourth layer 540. TiO$_2$ having the thickness 512 of about 2 nm is deposited via an ALD process for forming the first layer 510 on the wall 302 of the via 310. AlO$_x$ having the thickness 522 of about 2 nm is deposited via an ALD process for forming the second layer 520 on the first layer 510. TiO$_2$ having the thickness 512 of about 17 nm is deposited via an ALD process for forming the third layer 530 on the second layer 520. The fourth layer 540 may be a memory layer formed on the third layer 530. The fourth layer 540 may be formed from a metal oxide such as TiO$_x$ or other suitable material by an ALD process to the thickness 540 of about 2 nm. Thus, the order of the layers forming the selector device 550 and the memory cell may be reversed in the via 310.

Figure 6:
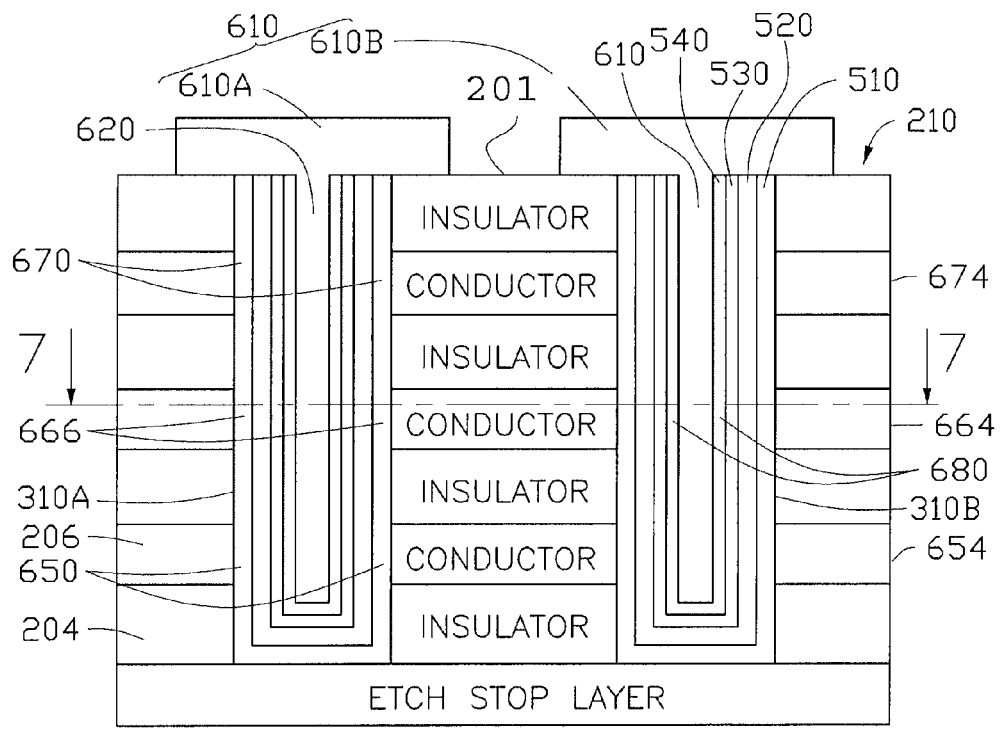
FIG. 6 illustrates a plan view of the example vertical stack in FIG. 5 having the devices formed therein, in accordance with certain embodiments of the present disclosure.

Turning to FIG. 6, FIG. 6 illustrates a plan view of the example vertical stack in FIG. 5 having memory cells 650, 660, 670 formed therein, in accordance with certain embodiments of the present disclosure. The vertical stack 210 has a top surface 201. The vertical stack 210 may be etched to remove the first, second, third, and fourth layers 510, 520, 530, 540 from the top surface 201 of the vertical stack 210. Alternately, the top surface 201 may be planarized to remove the first, second, third, and fourth layers 510, 520, 530, 540.

A conductive top electrode 610 may be deposited on the vertical stack 210. The conductive top electrode 610 may fill the vias 310. The conductive top electrode 610 may form a continuous layer across the top surface 201. The material of the conductive top electrode may be deposited via chemical vapor deposition (CVD) or other suitable process. The conductive top electrode 610 may be formed from tungsten (W), copper (Cu), molybdenum (Mo), chromium (Cr), gold (Au), tantalum (Ta), a polycrystalline form of silicon, or other suitably electrically conductive material. The conductive top electrode 610 for each via 310 may be electrically isolated from adjacent vias 310. The conductive top electrode 610 may be etched, trenched or electrically isolated by other suitable methods.

The second, third and fourth layers 520, 530, 540 may form in combination a selector device 550 for the memory cells formed in the vias 310. For example, the selector device 550 may be formed from the three layers 520, 530, 540 where the second layer 520 is made of TiO$_2$, the third layer 530 is Al$_2$O$_3$ and the fourth layer 540 is TiO$_2$. The selector device 550 may have a total thickness 554 of less than 21 nm. The selector device 550 provides a conformal junction material to a 3-d memory cell where the junction is adjacent to a non-volatile memory layer (e.g. phase change or metal oxide layer), such as the first layer 510. The selector device 550 and memory layer (i.e., first layer 510) allows for high density in the horizontal plane of the vertical stack as well as vertically in multiple levels of the vias. The multiple levels of interconnects in the selector device 550 minimizes sneak currents between adjacent memory cells that complicate or confuse the reading data stored in the memory cells. For example, a selector device 550, having the second layer 520 made of TiO$_2$, the third layer 530 of Al$_2$O$_3$ and the fourth layer 540 of TiO$_2$, may demonstrate less than about 1 µA of sneak current when measuring 0.4 volts across the selector device 550.

Optionally, a diffusion layer may be formed between the firsts layer 510 and the wall 312 of the via 310. The diffusion layer may be deposited during an ALD process prior to the deposition of the first layer 510. The diffusion layer may contain polysilicon, cobalt, tungsten, tantalum, or other suitable material. The diffusion layer may prevent the material from the conductive layer 206 from transporting to the first layer 510. For example, the diffusion layer may act as a barrier and prevent gold in the conductive layer 206 from migrating into the TiO$_2$ of the first layer 510.

Figure 7:
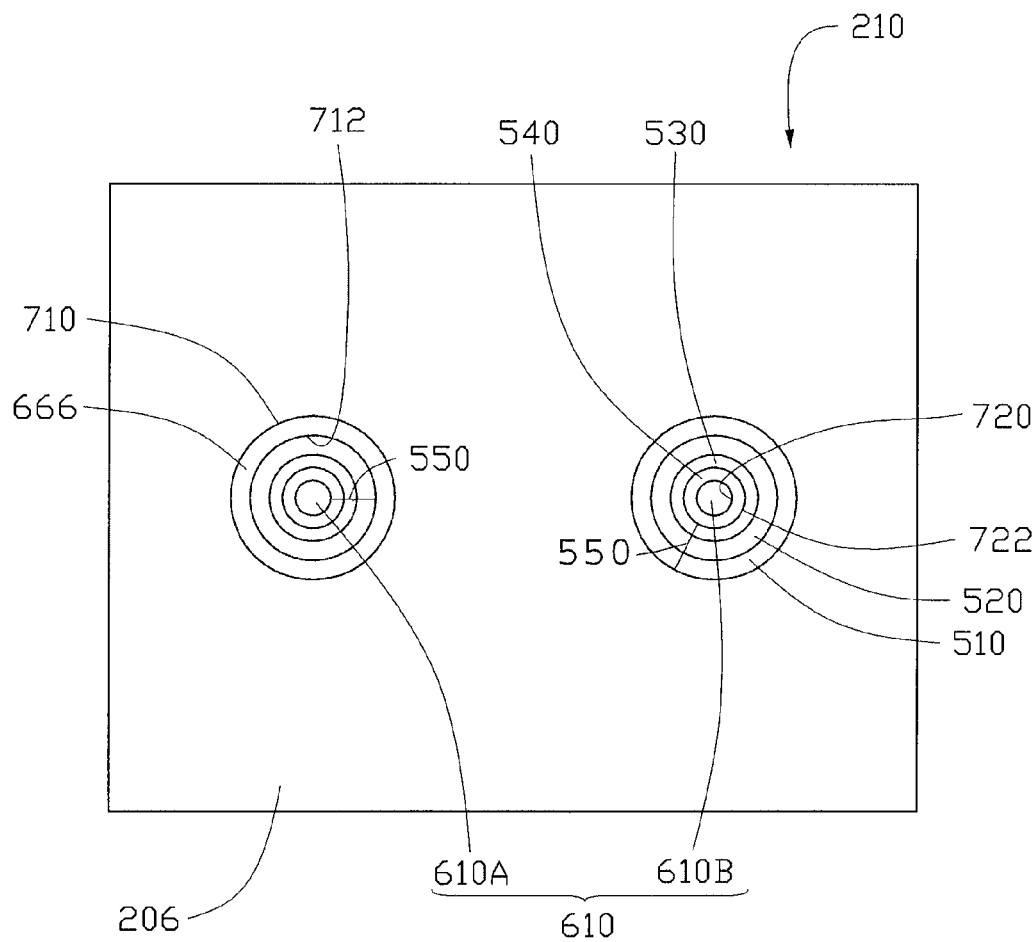
FIG. 7 illustrates a cross-sectional view through a conductive layer of the example vertical stack of FIG. 6, in accordance with certain embodiments of the present disclosure.

FIG. 7 illustrates a cross-sectional view through the conductive layer 206 of the example vertical stack 210 of FIG. 6, in accordance with certain embodiments of the present disclosure. The perspective view is taken through cross section line labeled 7-7. The cross section line 7-7 horizontally slices the vertical stack at one of the conductor layers 206 exposing memory cell 666. The memory cell 666 is a discrete location along the length of the memory layer addressed at the intersection of the conductor layer 206 and top electrode 610. The memory cell 666 is ringed shaped. In one embodiment, the memory cell 666 may resides in the first layer 510. An outer perimeter 710 of the memory cell 666 is in contact with the conductor layer 206. An inner perimeter 712 of the memory cell is in contact with the selector device 550. Briefly viewing FIG. 6, it can be seen that the memory cell 666 may be addressed by sampling an electrical current through the pathway through the conductive top electrode 610A and conductive layer 664. The electrical current may either store data or retrieve data from the memory cell 666. A value for the memory cell 666 may be measured by the current traversing the pathway. For example, the memory cell 666 may hold a value of one (1) indicative of a first resistance or a value of zero (0) indicative of a second resistance. The total resistance along the pathway may be measured to determine the value, i.e., data, stored in the memory cell 666.

In a second embodiment (not shown), a memory cell 680 may reside in the fourth layer 540. An inner perimeter 720 of the memory cell 680 is in contact with the conductive top electrode 610B. An outer perimeter 722 of the memory cell 680 is in contact with the selector device 550. Briefly viewing FIG. 6, it can be seen that the memory cell 680 may be address by sampling an electrical current through the pathway through the conductive top electrode 610B and conductive layer 664. A value for the memory cell 680 may be measured by the total resistance along the pathway similarly to the measuring of values stored in the memory cell 666.

Thus, electrically addressing the memory cells 666, 680 formed in a 3-d element has been simplified. Each memory cells 666, 680 is electrically isolating and addressing adjacent devices separated in the lateral direction or vertical direction may be done with ease. The high density memory cells 666, 680 are substantially isolated electrically thus reducing or even eliminating sneak currents between the memory cells 666, 680 making reading the memory easier and accurate. In one embodiment, the memory cells are spaced 100 nm apart from adjacent memory cells in the plane of the conductive layer 664. The memory cells in the substrate may be individually addressed through the conductive layers and the conductive top electrodes without sneak currents substantially altering the values determined by the electrical current passed therethrough.

The devices disclosed herein are scalable in 3D arrangements. It is to be understood that the description herein is not limited to PCM and RRAM devices, but rather is applicable to any memory cell, particularly those memory cells requiring high density. The embodiments disclosed herein are scalable, yet has a low footprint due to its 3D architecture.

While the foregoing is directed to embodiments of the present disclosure, other and further embodiments of the disclosure may be devised without departing from the basic scope thereof, and the scope thereof is determined by the claims that follow.

What is claimed is:

1. A memory device, comprising:
 a vertical stack of alternating layers of conductive and insulating layers wherein a top layer and a bottom layer are insulating layers;
 a plurality of vias disposed through the vertical stack from the top layer to the bottom layer;
 a memory layer disposed adjacent the conductive layers in the vias;
 a selector device disposed adjacent the memory layer, wherein the selector device comprises multiple layers of dissimilar metal oxides;
 a lateral electrical contact to the memory layer; and
 a top contact electrically connected to the conductive layer through a portion of the memory layer and the portion of the memory layer is configured to store data therein.

2. The memory device of claim 1 wherein the multiple layers of dissimilar metal oxides comprises:
 a first layer of material;
 a third layer of material; and
 a second layer of material disposed between the first and third layer of material and wherein a thickness of the first, second and third layer is less than about 21 nm.

3. The memory device of claim 2 wherein the memory layer is formed from a metal oxide, the first layer is formed from $TiO_2$, the second layer is formed from $Al_2O_3$, and the third layer is formed from $TiO_2$.

4. The memory device of claim 3 wherein the first layer has a first thickness of about 17 nm and is disposed on the memory layer.

5. The memory device of claim 3 wherein the third layer has a third thickness of about 17 nm and is disposed on the memory layer.

6. The memory device of claim 3 wherein the memory layer is formed from one of AlN, $TaO_x$, $HfO_x$ or $TiO_x$.

7. The memory device of claim 2 wherein the first layer of material and the third layer of material are of the same material.

8. The memory device of claim 7 wherein the first layer of material and the third layer of material are not of the same thickness as the second layer of material.

9. A memory device disposed in a vertical substrate stack having alternating layers of conductive layers and insulating layers, wherein the vertical stack has one more insulating layer than conductive layers and a bottom layer being an etch stop layer and the top layer being one of the insulating layers, the memory device comprising:
 a plurality of vias disposed through the top layer of the vertical stack to the etch stop layer;
 a memory layer disposed adjacent the conductive layers in the vias;
 multiple layers of dissimilar metal oxide layers adjacent the conductive layers in the vias configured to store a value of resistance at discrete locations along the metal oxide layer;
 a plurality of layers disposed adjacent the memory layer;
 a lateral electrical contact to the memory layer; and
 a top contact, wherein the top contact is electrically connected to the conductive layer through the plurality of layers at one of the discrete locations along the metal oxide layer.

10. The memory device of claim 9 wherein the metal oxide layer is comprised of:
 one of AlN, $TaO_x$, $HfO_x$ or $TiO_x$ or combinations thereof.

11. The memory device of claim 9 wherein the plurality of layers comprises:
 a first layer of $TiO_2$;
 a third layer of $TiO_2$; and
 a second layer of $Al_2O_3$ disposed between the first and third layer, wherein a thickness of the first, second and third layer is less than about 21 nm.

12. The memory device of claim 11 wherein the first layer has a first thickness of about 17 nm and is disposed on the memory layer.

13. The memory device of claim 11 wherein the third layer has a third thickness of about 17 nm and is disposed on the memory layer.

14. A memory device, comprising:
 a vertical stack of alternating layers of conductive and insulating layers wherein a top layer and a bottom layer are insulating layers;
 a plurality of vias disposed through the vertical stack from the top layer to the bottom layer;
 a memory layer disposed adjacent the conductive layers in the vias;
 a selector device disposed adjacent the memory layer, wherein the selector device comprises multiple layers of dissimilar metal oxides, wherein the multiple layers of dissimilar metal oxides comprises:
 a first layer of $TiO_2$ of in between 10 nm to 20 nm thick,
 a second layer of $Al_2O_3$ of in between 1 nm to 5 nm thick, and
 a third layer of $TiO_2$ of in between 1 nm to 5 nm thick wherein the thickness for each of the first layer and the third layer is greater than the thickness of the second layer;

one or more lateral electrical contacts to the memory layer is formed through the conductive layer; and a top contact electrically connected to the one or more lateral electrical contacts through a portion of the memory layer and the portion of the memory layer is configured to store data therein.

* * * * *